US006593678B1

(12) United States Patent
Flowers (10) Patent No.: US 6,593,678 B1
(45) Date of Patent: Jul. 15, 2003

(54) SURFACE ACOUSTIC WAVE FILTER HAVING DIMINISHED BANDWIDTH AND METHOD OF OPERATING THE SAME

(75) Inventor: James E. Flowers, Dallas, TX (US)

(73) Assignee: Clarisay, Inc., Dallas, TX (US)

( * ) Notice: Subject to any disclaimer, the term of this patent is extended or adjusted under 35 U.S.C. 154(b) by 0 days.

(21) Appl. No.: 09/695,672

(22) Filed: Oct. 24, 2000

(51) Int. Cl.[7] .............................................. H01L 41/08

(52) U.S. Cl. .................................................. 310/313 R
(58) Field of Search ........................ 310/313; 383/193, 383/194, 196; H03H 9/64

(56) References Cited

U.S. PATENT DOCUMENTS

| | | | | | |
|---|---|---|---|---|---|
| 3,582,840 | A | * | 6/1971 | DeVries | 333/193 |
| 4,314,215 | A | * | 2/1982 | Tanji et al. | 333/193 |
| 4,649,357 | A | * | 3/1987 | Nagai et al. | 333/196 |
| 4,931,755 | A | * | 6/1990 | Sakamoto et al. | 333/193 |
| 6,043,585 | A | * | 3/2000 | Plessky et al. | 310/313 R |

FOREIGN PATENT DOCUMENTS

JP           409167793       * 5/1997

OTHER PUBLICATIONS

A A Ayon, Silicon wafer bonding for MEMS manufacturing, Magazine, Aug. 1999, 6 pages, Issue No. 8, Solid State Technology.

Larry Dues and Tom Adams, Checking for wafer–to–wafer bonding integrity, Online article, Dec. 1999, 3 pages, Electronics Engineer.

Y.H. Lo, Y. Xiong, Y. Zhou, Z. Shu, Tuoh–Bin NG*, and S.A. Bashar, Room Temperature Stress–Free GaAs/Si Wafer Bonding Technology for Optical Interconnects, 2 pages, Heterogeneous Optoelectronics Technology Center.

Tadatomo Suga, Recent Progress in Surface Activated Bonding, 9 pages, Research Center for Advanced Science and Technology (RCAST), University of Tokyo.

Albert Li, History and Background of Low Temperature Wafer Bonding, Online article, 5 pages.

T. Suga, Feasibility of Surface Activated Bonding for Ultra–fine Pitch Interconnection—A New Concept of Bump–less Direct Bonding for System Level Packaging, 4 pages, Electronic Components and Technology Conference, Research Center for Science and Technology, The University of Tokyo.

H. Takagi, R. Meada, N. Hosoda, and T. Suga, Si/Si Interface Bonded at Room Temperature by Ar Beam Surface Activation, Book, 1999, 4 pages, vols. 294–296 pp. 341–344, Trans Tech Publications Ltd., Switzerland.

R.W. Bower and F.Y.–J. Chin, Low Temperature Direct Silicon Wafer Bonding using Argon Activation, Journal Paper, May 1, 1997, 1 page, vol. 36 No. 5A pp. L527–8, Publication Office, Japanese Journal Appl. Phys, Japan.

* cited by examiner

Primary Examiner—Thomas M. Dougherty
Assistant Examiner—Karen Addison
(74) Attorney, Agent, or Firm—Hitt Gaines & Boisbrun (57) ABSTRACT

An element of a SAW filter network, a method of filtering a signal and a SAW filter network incorporating the element or the method. In one embodiment, the element includes: (1) a SAW resonator having a nominal usable bandwidth and (2) an extrinsic capacitor coupled in parallel with the SAW resonator, the extrinsic capacitor interacting with the SAW resonator to cause an anti-resonance frequency of the element to move toward a resonance frequency thereof and thereby decrease an overall operating bandwidth of the element.

15 Claims, 8 Drawing Sheets

SURFACE ACOUSTIC WAVE FILTER HAVING DIMINISHED BANDWIDTH AND METHOD OF OPERATING THE SAME

TECHNICAL FIELD OF THE INVENTION

The present invention is directed, in general, to surface acoustic wave (SAW) filters and, more specifically, to SAW filters having a diminished bandwidth and method of operating such filters to process signals.

BACKGROUND OF THE INVENTION

Electronic signal processing by means of selective manipulation of a surface acoustic wave (SAW) on piezoelectric substrates typically uses thin-film transducer structures. These structures usually consist of an exactingly constructed opposing pair of parallel fingers sets that are interleaved, but do not touch. Each opposing pair of finger sets has an electrical terminal that allows an input AC signal to be coupled to one finger set and an output AC signal to be obtained from the other finger set. SAW filters act as an electrical-mechanical-electrical energy converter, the filtering being performed within the mechanical domain of the piezoelectric substrate. Application of an appropriate input electrical AC signal provides the stimulus to create a SAW that may typically be a Rayleigh wave with motion confined to about one acoustic wavelength under the free surface of the piezoelectric substrate. Alternatively, the acoustic excitation may be a "leaky wave", which also finds application in modern radio frequency devices.

The electronics industry has applied such SAW signal processing to the design of analog electrical filters operating at selected frequencies in the range of about 10 megahertz to 2½ gigahertz. SAW devices, operating in the Rayleigh wave mode, can generally be designed to provide quite complex signal processing functions within a single package that contains only a single piezoelectric substrate with superimposed thin-film interdigital transducers. For example, bandpass filters can be designed to achieve responses that would require several hundred inductors and capacitors in conventional LC filter designs.

SAW filter devices may be mass produced using semiconductor microfabrication techniques thereby providing outstanding reproducibility in performance from device to device. Since SAW filters may be implemented in small, rugged, light and power efficient modules, they find important applications in mobile, wireless and spaceborne communication systems.

SAW filter designers are under constant pressure to improve the insertion loss of filter networks, especially in applications involving low level signals at radio frequencies. Additionally, SAW filter designers must combine a suite of SAW transducers to provide a required bandpass shape. Shaping the passband response often requires using a collection of many different SAW transducers. Each of the SAW transducers must typically be designed individually wherein its resonant frequency, and therefore its interdigital structure and associated individual response width, is chosen to meet a particular overall network passband requirement. The inability to easily tailor individual SAW resonator response widths (coupling) for a chosen resonant frequency makes the collective passband shaping more difficult and increases the cost of the solution.

Accordingly, what is needed in the art is a simple and cost effective way to judiciously narrow the bandwidth of a SAW filter resonator.

SUMMARY OF THE INVENTION

To address the above-discussed deficiencies of the prior art, the present invention provides an element of a SAW filter network, a method of filtering a signal and a SAW filter network incorporating the element or the method. In one embodiment, the element includes: (1) a SAW resonator having a nominal bandwidth and (2) an extrinsic capacitor coupled in parallel with the SAW resonator, the extrinsic capacitor interacting with the SAW resonator to cause an anti-resonance frequency of the element to move toward a resonance frequency thereof and thereby decrease an overall operating bandwidth of the element.

The present invention introduces the broad concept of employing an extrinsic capacitor (a capacitor outside of the SAW resonator itself) to modify the anti-resonance frequency of the SAW resonator. The element (a combination of the SAW resonator and the extrinsic capacitor) is thereby given a diminished operating bandwidth (passband or notch). A diminished operating bandwidth is particularly advantageous in low cost applications, wherein downstream signal processing benefits from improved filtering.

In one embodiment of the present invention, the SAW resonator and the extrinsic capacitor share common terminals. In an embodiment to be illustrated and described, the SAW resonator and extrinsic capacitor are formed between a pair of parallel terminals on a common piezoelectric substrate.

In one embodiment of the present invention, the SAW filter element is a first SAW resonator and the element further includes a second SAW resonator non-transversely coupled in series with the first SAW resonator. In a related embodiment, the SAW resonator is a first SAW resonator and the SAW filter element further includes a second SAW resonator non-transversely coupled in series with the first SAW resonator and in parallel with the extrinsic capacitor. In an embodiment to be illustrated and described, certain elements of a SAW filter network include first and second SAW resonators non-transversely coupled in series and a single extrinsic capacitor coupled in parallel thereto. The extrinsic capacitor causes the anti-resonance frequencies of both the first and second SAW resonators to approach the resonance frequencies thereof and thereby narrow the bandwidth of the element as a whole.

In one embodiment of the present invention, the extrinsic capacitor has an intrinsic resonant frequency greater than the resonance frequency. Alternatively, the extrinsic capacitor has an intrinsic resonant frequency less than the resonance frequency.

In one embodiment of the present invention, the SAW resonator comprises an interdigitated central region and opposing shorted end regions. In a manner that is known to those skilled in the pertinent art, the interdigitated central region supports a SAW, and the shorted end regions reflect and contain it.

In one embodiment of the present invention, the SAW filter network has a resonance frequency between 900 and 920 megahertz. Although those skilled in the pertinent art will understand that such frequency is particularly advantageous for portable telephone applications, the present invention is not limited to a particular band or bandwidth.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
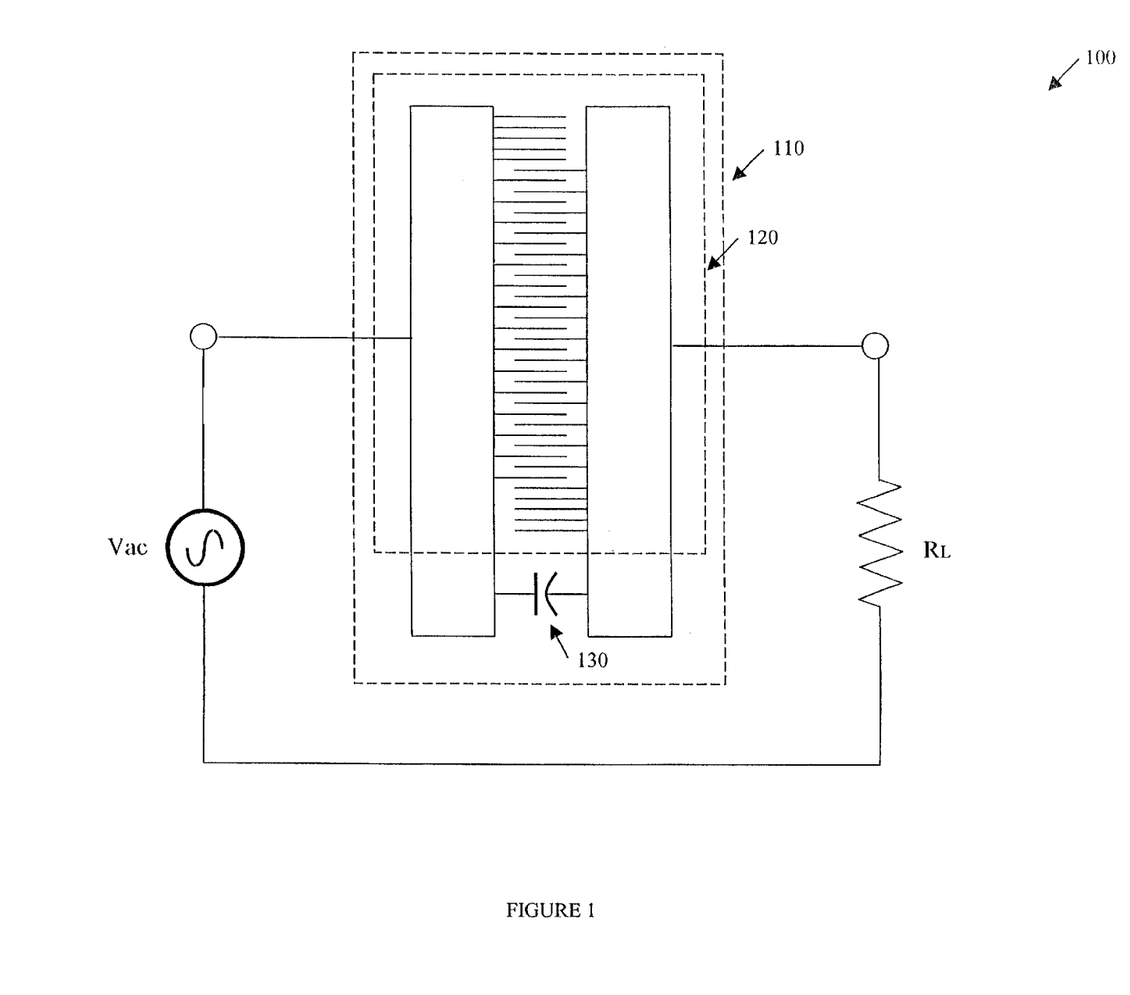
FIG. 1 illustrates a schematic diagram of a circuit incorporating a SAW filter element constructed according to the principles of the present invention.

Referring initially to FIG. 1, illustrated is a schematic diagram of a circuit 100 incorporating a SAW filter element constructed according to the principles of the present invention. The circuit 100 includes an AC input voltage Vac, a SAW filter element 110 and a load $R_L$. The SAW filter element 110 includes a SAW resonator 120 having a nominal bandwidth and an extrinsic capacitor 130 coupled in parallel with the SAW resonator 120. The extrinsic capacitor 130 interacts with the SAW resonator 120 to cause an anti-resonance frequency of-the SAW filter element 110 to move toward a resonance frequency thereof and thereby decrease an overall operating bandwidth of the SAW filter element 110.

In the illustrated embodiment, the SAW resonator 120 and the extrinsic capacitor 130 share common terminals that consist of a pair of essentially parallel conductive strips on a common piezoelectric substrate. Application of the AC input voltage Vac to the load $R_L$ is frequency dependent. Maximum transmission of the AC input voltage Vac to the load $R_L$ occurs at a resonant frequency f0 of the SAW filter element 110 wherein a maximum value of the SAW filter admittance Y also occurs. Operating characteristics of the SAW filter 120 and the extrinsic capacitor 130 may be selected to judiciously tailor the frequency response characteristics of the SAW filter element 110. The presence of the extrinsic capacitor 130 provides a narrowing of the frequency response characteristic of the SAW filter element 110 when compared to the frequency response characteristic of the SAW resonator 120 alone.

Figure 2:
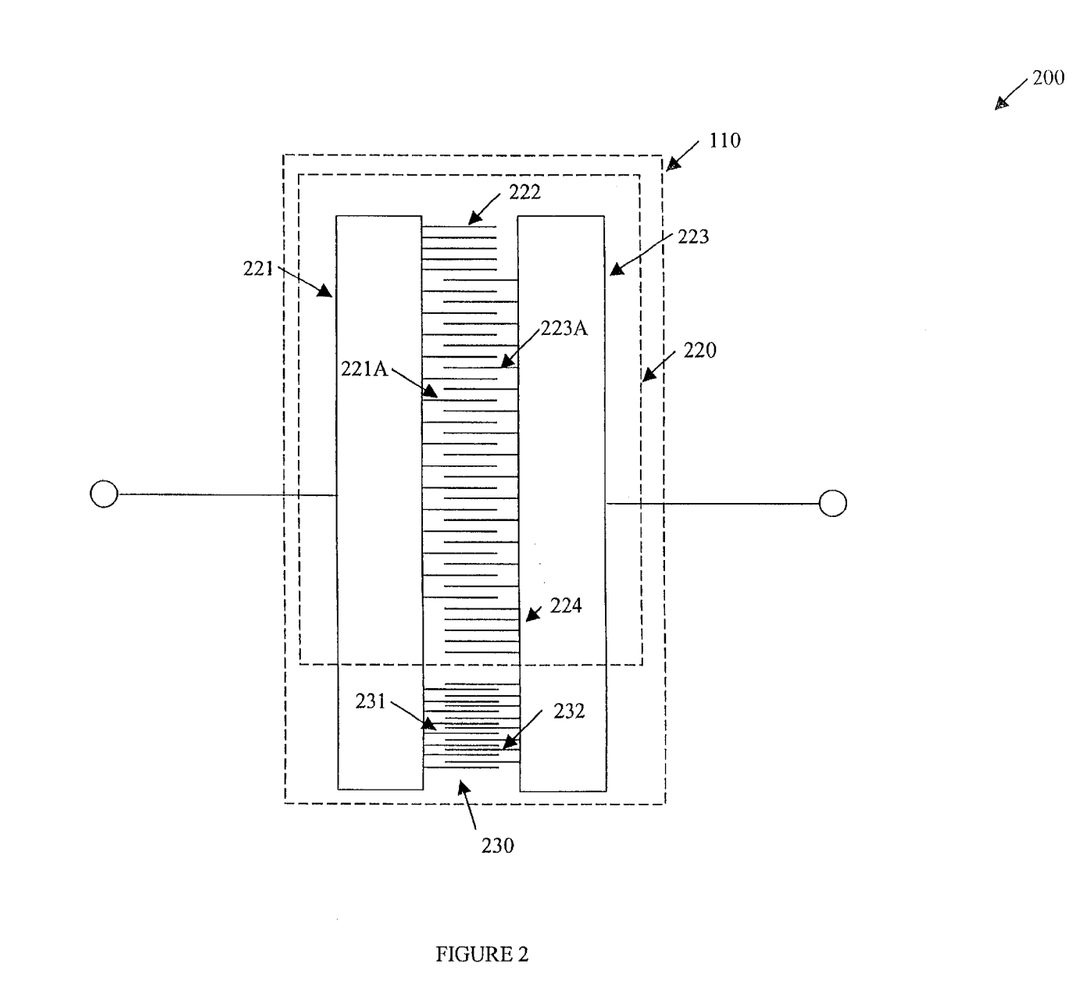
FIG. 2 illustrates a plan view of an embodiment of the SAW filter element of FIG. 1, constructed according to the principles of the present invention.

Turning now to FIG. 2, illustrated is a plan view 200 of an embodiment of the SAW filter element 110 of FIG. 1, constructed according to the principles of the present invention. The illustrated embodiment of the SAW filter element 110 includes a SAW resonator 220 and an extrinsic capacitor 230 that share common first and second terminals 221, 223. The SAW resonator 220 includes a first SAW finger set 221A and a first reflection finger set 222 connected to the first terminal 221. Similarly, the SAW resonator 220 includes a second SAW finger set 223A and a second reflection finger set 224 connected to the second terminal 223. The extrinsic capacitor 230 includes a first capacitor finger set 231 connected to the first terminal 221 and a second capacitor finger set 232 connected to the second terminal 223.

The first SAW finger set 221A-and the second SAW finger set 223A comprise a SAW interdigitated central region 221A–223A of the SAW resonator 220. Additionally, the first reflection finger set 222 and the second reflection finger set 224 comprise opposing SAW shorted end regions 222/224 of the SAW filter 220. The SAW interdigitated central region 221A–223A supports a SAW, and the SAW shorted end regions 222/224 reflect and contain the SAW. Proper operation and containment of the SAW requires very precise construction of the SAW interdigitated central region 221A–223A and the opposing SAW shorted end regions 222/224.

Similarly, the first capacitor finger set 231 and the second capacitor finger set 232 form a capacitor interdigitated region 231–232 between the first and second terminals 221, 223. In the illustrated embodiment, the capacitor interdigitated region 231–232 has closer finger spacing than the SAW interdigitated central region 221A–223A. This characteristic advantageously places an intrinsic resonant frequency of the extrinsic capacitor 230 above the resonant frequency of the SAW resonator 220 wherein such advantage will be addressed in following discussions. In an alternative embodiment, the extrinsic capacitor 230 may have an intrinsic resonant frequency less than the resonance frequency of the SAW resonator 220 due to broader finger spacing. An additional benefit of the use of closer finger spacing is that it typically requires less additional piezoelectric substrate area thereby supporting higher device densities and smaller overall device sizes.

Figure 3:
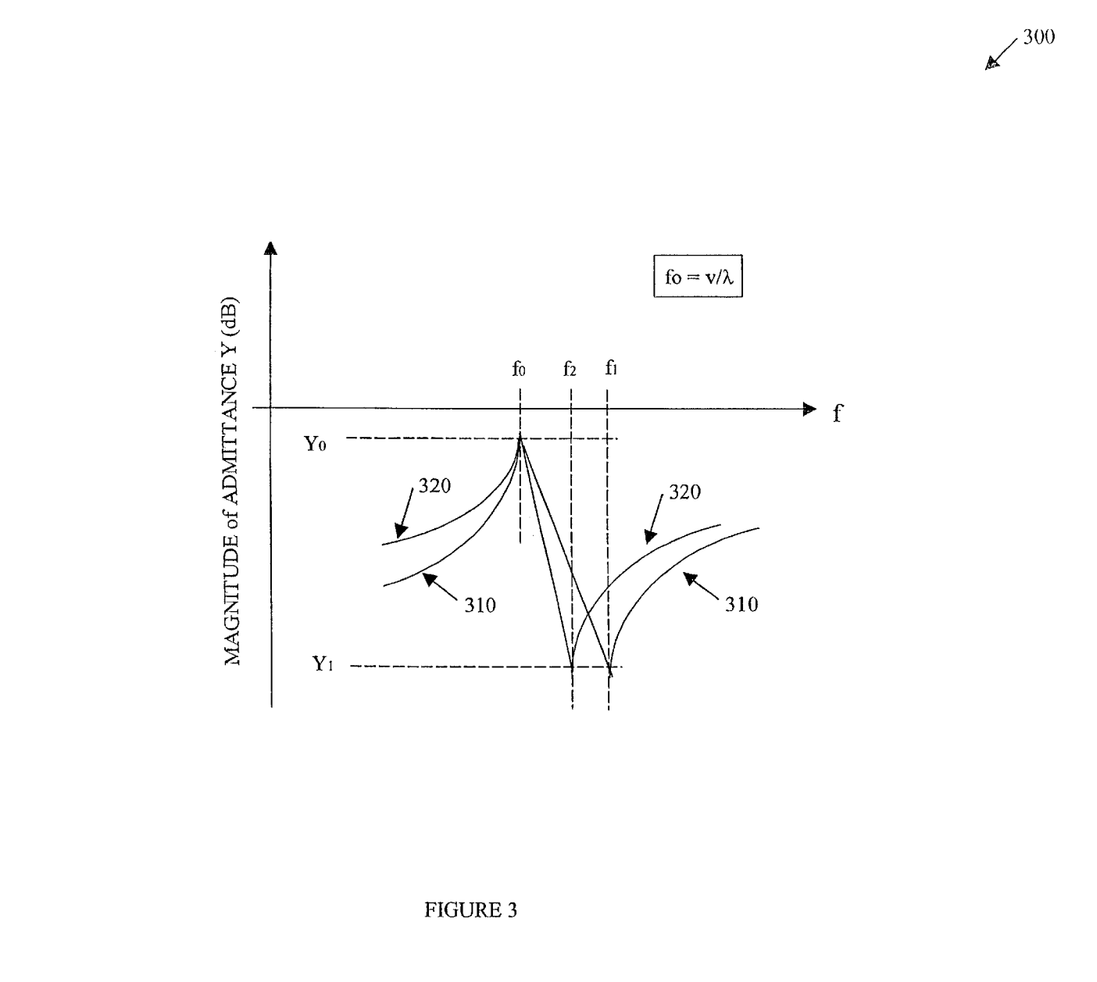
FIG. 3 illustrates a graphical representation of an embodiment of operating characteristics associated with a SAW filter element constructed according to the principles of the present invention.

Turning now to FIG. 3, illustrated is a graphical representation of an embodiment of operating characteristics 300 associated with a SAW filter element constructed according to the principles of the present invention. The operating characteristics 300 include a first operating characteristic 310 and a second operating characteristic 320, which may be associated with the SAW resonator 120 or the SAW resonator 220 of FIGS. 1 and 2, respectively. The first operating characteristic 310 and the second operating characteristic 320 are plots of a magnitude of an admittance Y, expressed in dB and as a function of frequency f, demonstrated by the SAW resonator 120 and the SAW filter element 110, respectively.

The admittance Y may be seen to demonstrate a maximum absolute value of admittance $Y_0$ at a resonant frequency $f_0$ for both the first and second operating characteristics 310, 320. Additionally, the admittance Y may be seen to demonstrate a minimum value of admittance $Y_1$. In the illustrated embodiment, the minimum value of admittance $Y_1$, is seen to occur at a first anti-resonant frequency $f_1$ for the SAW resonator 120 and at a second anti-resonant frequency $f_2$ for the SAW filter element 110. Addition of the extrinsic capacitor 230, shown in FIG. 2, causes a shift to the second anti-resonant frequency $f_2$ from the first anti-resonant frequency $f_1$, thereby decreasing the overall bandwidth of the SAW filter element 110.

Figure 4:
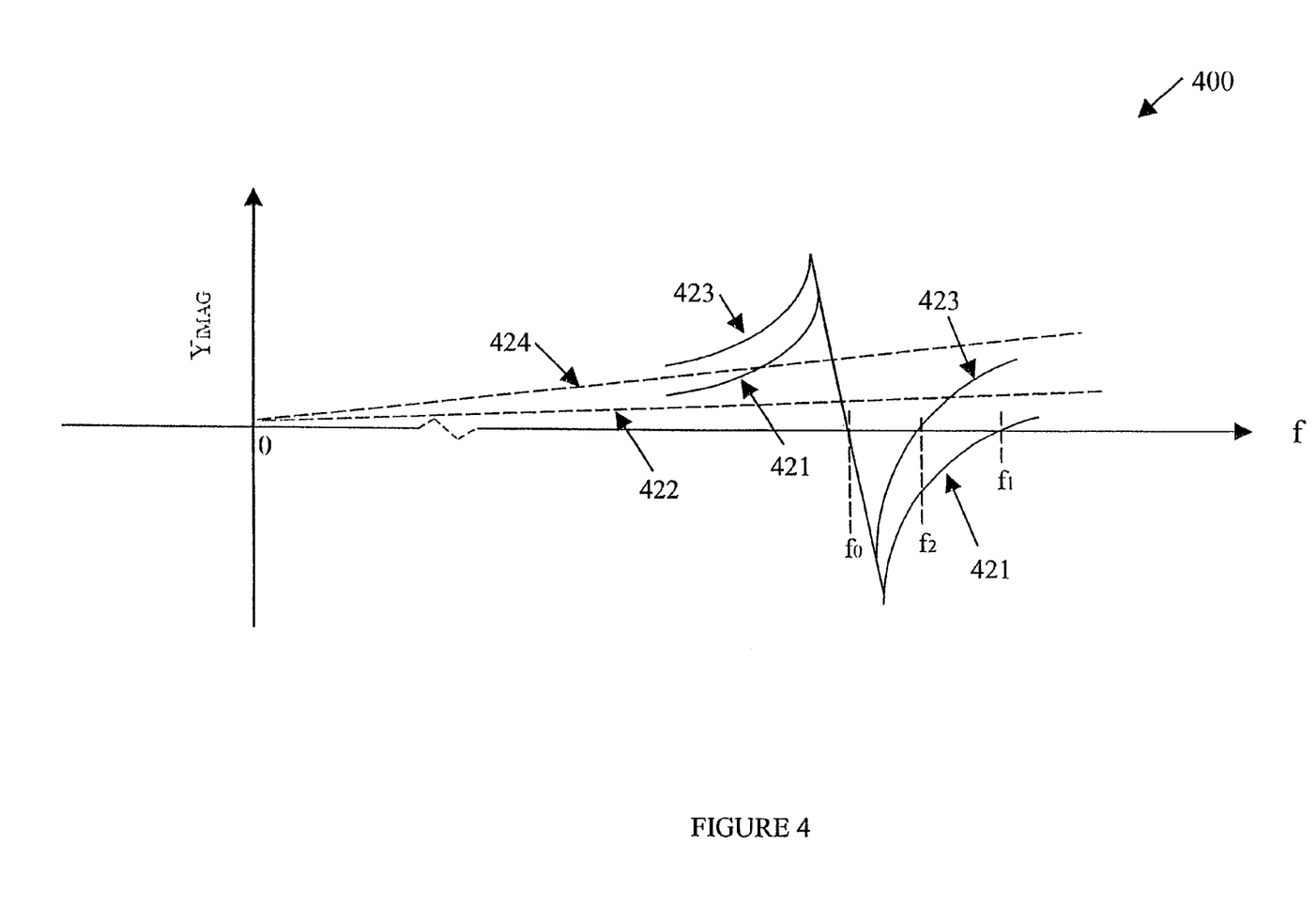
FIG. 4 illustrates a graphical representation of an operating characteristic showing embodiments of first and second waveforms displaying an imaginary admittance as a function of frequency constructed according to principles of the present invention.

Turning now to FIG. 4, illustrated is a graphical representation of an operating characteristic 400 showing embodiments of first and second waveforms displaying an imaginary admittance $Y_{imag}$ as a function of frequency constructed according to principles of the present invention. The operating characteristic 400 includes a first imaginary waveform 421 and a second imaginary waveform 423. Each of the first and second imaginary waveforms 421, 423 are representative of a SAW filter element which includes a SAW resonator and an extrinsic capacitor as shown in FIGS. 1 and 2 above.

The general shape of the first and second imaginary waveforms 421, 423 are similar. However, the second imaginary waveform 423 yields slightly greater maximum and minimum values of imaginary admittance $Y_{imag}$ than the first imaginary waveform 421. First and second asymptotes 422, 424 are proportional to first and second capacitance values $C_1$, $C_2$, respectively, that may be formed by the extrinsic capacitor 230. In this example, the second capacitance value $C_2$ is greater than the first capacitance value $C_1$.

Both the first and second imaginary waveforms 421, 423 exhibit an "inductive swing" between the frequency $f_0$ and a first imaginary waveform frequency $f_1$, and the frequency $f_0$ and a second imaginary waveform frequency $f_2$, respectively. It may also be noted in FIG. 4 that the first imaginary waveform frequency $f_1$, is greater that the second imaginary waveform frequency $f_2$. Therefore, the greater second capacitance value $C_2$ causes a "thinning out of the frequency response" or decrease in bandwidth of the second imaginary waveform 423 as compared to the first imaginary waveform 421.

An extrinsic capacitor, such as those discussed in FIGS. 1 and 2 also exhibits a real admittance $Y_{real}$ that is a function of operating frequency. The real admittance $Y_{real}$ and the imaginary admittance $Y_{imag}$ may be considered to be parallel-coupled to form a total admittance Y for the extrinsic capacitor. In the illustrated embodiment, the real admittance $Y_{real}$ always has a value greater than zero and has a maximum value that occurs at an intrinsic resonant frequency $f_{0cap}$ for an extrinsic capacitor.

As discussed earlier in the illustrated embodiment, the intrinsic resonant frequency $f_{0cap}$ for the extrinsic capacitor 230 is greater than the resonant frequency $f_0$ of the SAW resonator 220. A typical ratio of the intrinsic resonant frequency $f_{0cap}$ to the resonant frequency $f_0$ may be in the range of about 1.3:1 to 1.5:1. This condition allows an operating point where the real admittance $Y_{real}$ is reasonably small, for the extrinsic capacitor 230 at an operating frequency $f_0$. This condition reduces losses and allows the imaginary admittance $Y_{imag}$ to denominate the frequency response of the extrinsic capacitor 230 in the desired operating range.

Figure 5:
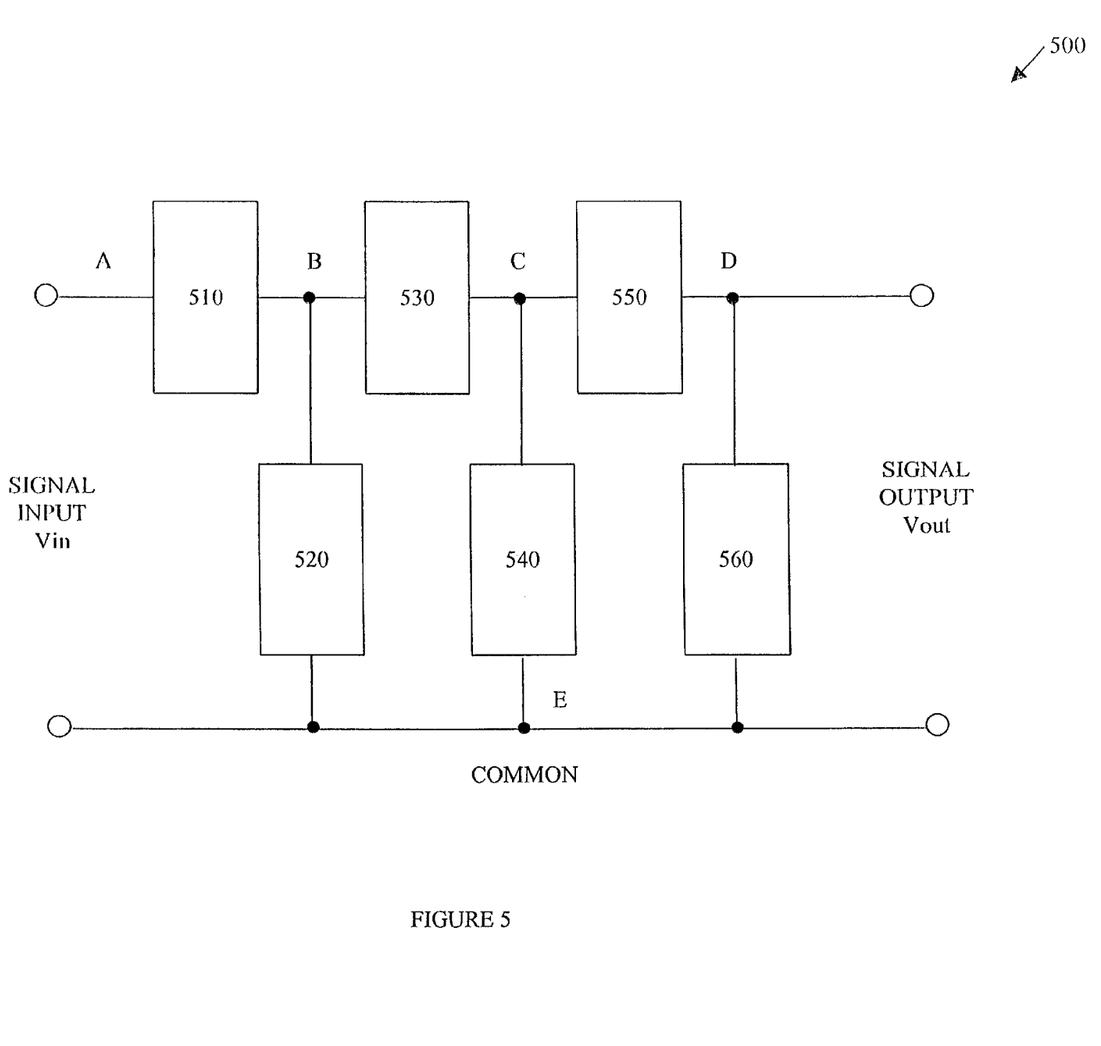
FIG. 5 illustrates an embodiment showing a schematic representation of a SAW filter network constructed according to principles of the present invention.

Turning now to FIG. 5, illustrated is an embodiment showing a schematic representation of a SAW filter network 500 constructed according to principles of the present invention. The SAW filter network 500 includes first, second and third series SAW filter elements 510, 530, 550 coupled between nodes A and B, B and C, and C and D respectively. The SAW filter network 500 also includes first, second and third parallel SAW filter elements 520, 540, 560 coupled between nodes B and E, C and E, and D and E respectively, where node E is a common node. An input signal Vin is applied between nodes A and E, and an output signal Vout is obtained between nodes D and E.

In the illustrated embodiment, each of the SAW filter elements includes at least one SAW resonator that is parallel coupled to an extrinsic capacitor according to the principles of the present invention. By judicious selection of both the resonant frequencies of the respective SAW resonators and the anti-resonant frequencies afforded by their associated extrinsic capacitors, the series and parallel SAW filter elements may be designed to achieve the overall bandwidth required in the passband of the SAW filter network 500.

Figure 6:
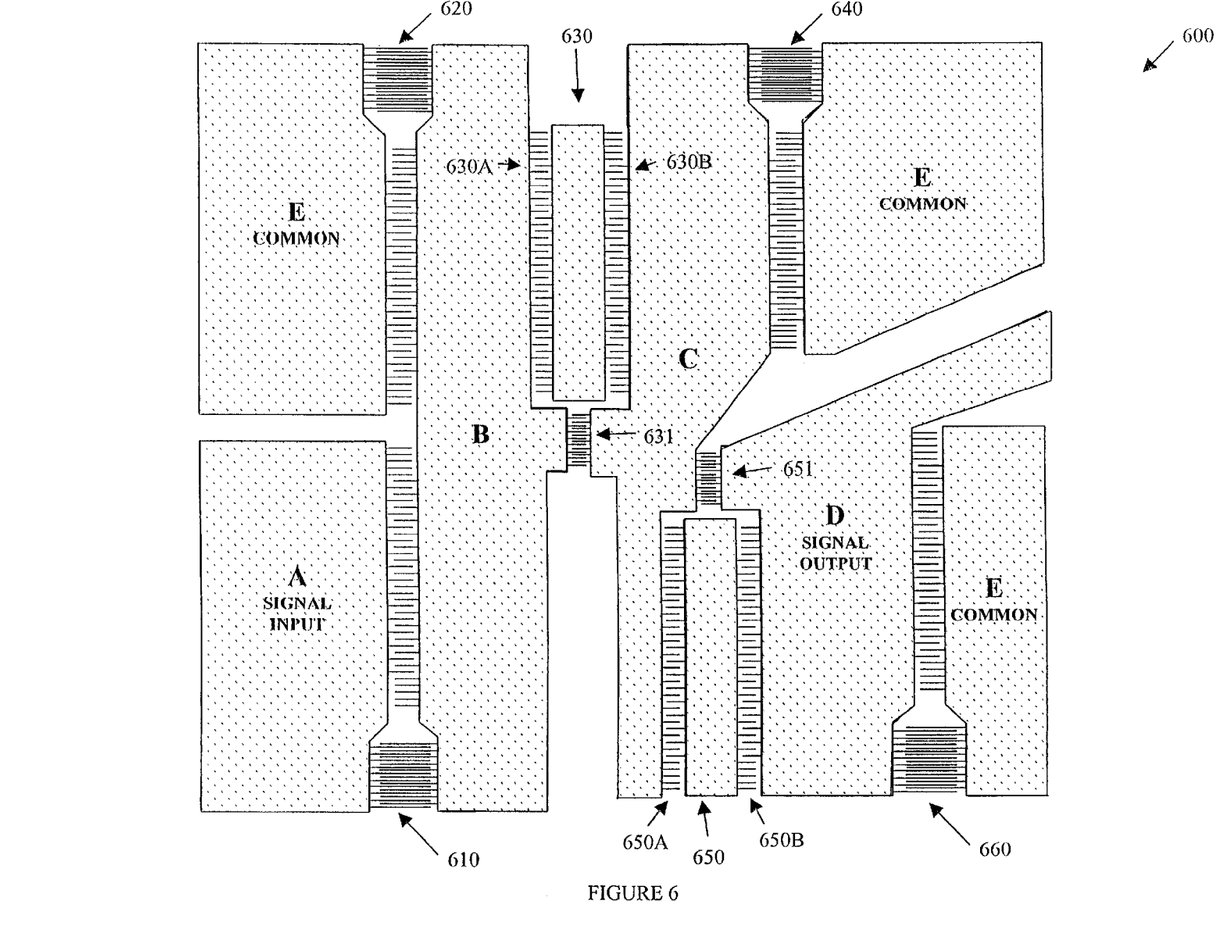
FIG. 6 illustrates a plan view of a physical embodiment of a SAW filter network representative of the SAW filter network of FIG. 5.

Turning now to FIG. 6, illustrated is a plan view of a physical embodiment of a SAW filter network 600 representative of the SAW filter network 500 of FIG. 5 and constructed according to the principles of the present invention. The SAW filter network 600 includes first, second and third series SAW filter elements 610, 630, 650 coupled between terminals A and B, B and C, and C and D respectively. The SAW filter network 600 also includes first, second and third parallel SAW filter elements 620, 640, 660 coupled between terminals B and E, C and E, and D and E respectively, where terminal E is a common terminal. An input signal Vin is applied between terminals A and E, and an output signal Vout is obtained between terminals D and E.

Each of the first series SAW filter element 610 and the first, second and third parallel SAW filter elements 620, 640, 660 includes a single SAW resonator that is parallel coupled to an extrinsic capacitor. In the illustrated embodiment of the present invention, the second series SAW filter element 630 includes first and second SAW resonators 630A, 630B, which are themselves coupled in series, that share a single parallel coupled extrinsic capacitor 631. Additionally, the third series SAW filter element 650 includes third and fourth SAW resonators 650A, 650B, which are also coupled in series, that share a single parallel coupled extrinsic capacitor 651.

Figure 7A:
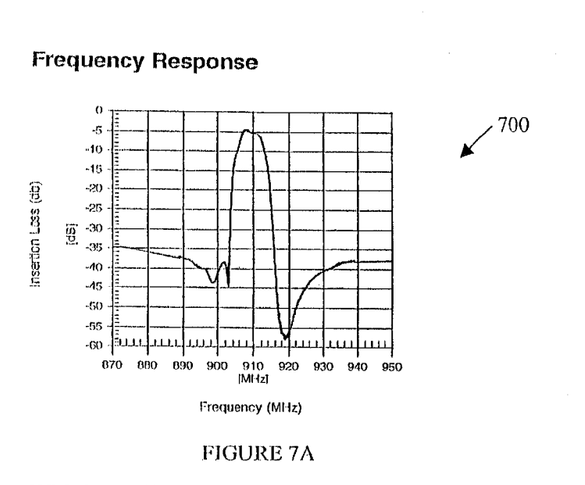
FIG. 7A illustrates an operating characteristic showing a frequency response of the SAW filter network of FIG. 6.
Figure 7B:
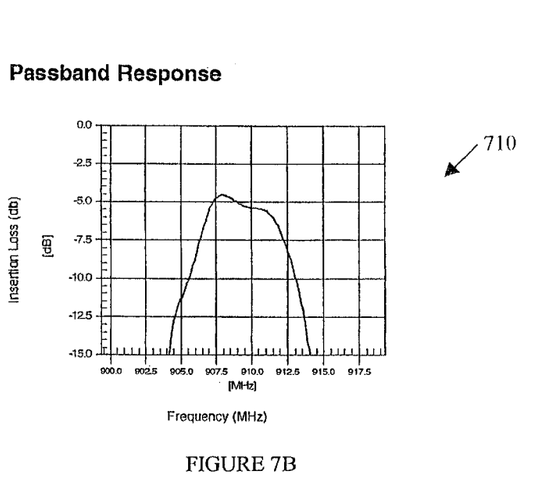
FIG. 7B illustrates an operating characteristic showing a passband detail-response of the SAW filter network of FIG. 6.

In both of these latter exemplary embodiments, the SAW resonators are non-transversely coupled in series. Series coupling of the appropriate SAW resonator pairs in this manner essentially sharpens the overall impedance response of the SAW filter element at resonance thereby improving narrowband operator. The shared parallel extrinsic capacitor causes the anti-resonance frequencies of both of the series coupled SAW filters to approach their resonance frequency, concomitantly further narrowing the bandwidth of the SAW filter element as a whole. An example of the resulting bandpass waveforms illustrating this result is shown in FIG. 7.

Turning now to FIGS. 7A, 7B, 7C and 7 together, illustrated are typical operating characteristics 700, 710, 720, 730 of the SAW filter network 600 of FIG. 6. The operating characteristic 700 illustrates a frequency response of the SAW filter network 600. The collection and arrangement of SAW filter elements included in the SAW filter network 600 have both broadened and shaped the passband response to provide a more optimum characteristic. The operating characteristic 710 illustrates a passband detail response showing an insertion loss of less than 5 decibels around a resonant frequency between 900 and 920 megahertz. Although those skilled in the pertinent art will understand that such frequency is particularly advantageous for portable telephone applications, the present invention is not limited to a particular band or bandwidth.

Figure 7C:
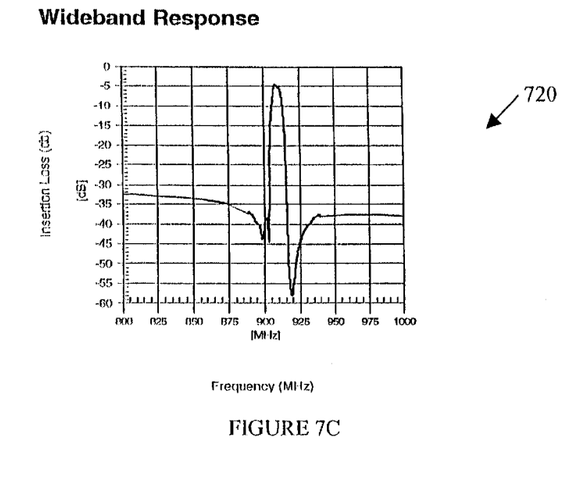
FIG. 7C illustrates an operating characteristic showing a wideband response of the SAW filter network of FIG. 6.
Figure 7D:
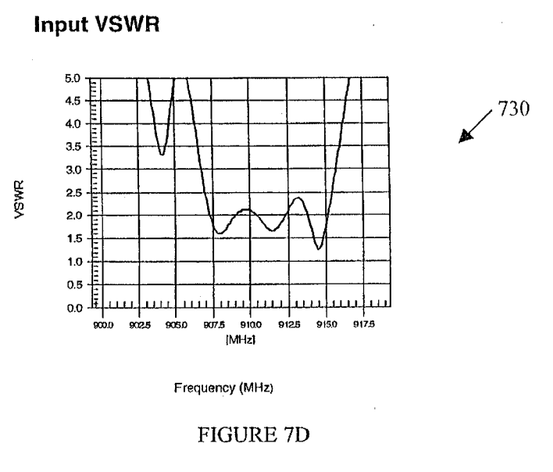
FIG. 7D illustrates an operating characteristic showing a voltage standing wave ratio (VSWR) of the SAW filter network of FIG. 6.

This lower value of insertion loss was enhanced through the use of SAW filter elements that include first and second SAW resonators, which are themselves coupled in series, thereby improving the shape factor of the SAW filter elements. The operating characteristic 720 illustrates a wideband response of the SAW filter network 600 showing a minimum rejection of about 32 dB for frequencies out of the passband. The operating characteristic 730 illustrates a voltage standing wave ratio (VSWR) of the SAW filter network 600 around the passband, which drops to a value of about 1.5:1 in the passband, and is generally less than 2.5:1.

Figure 8:
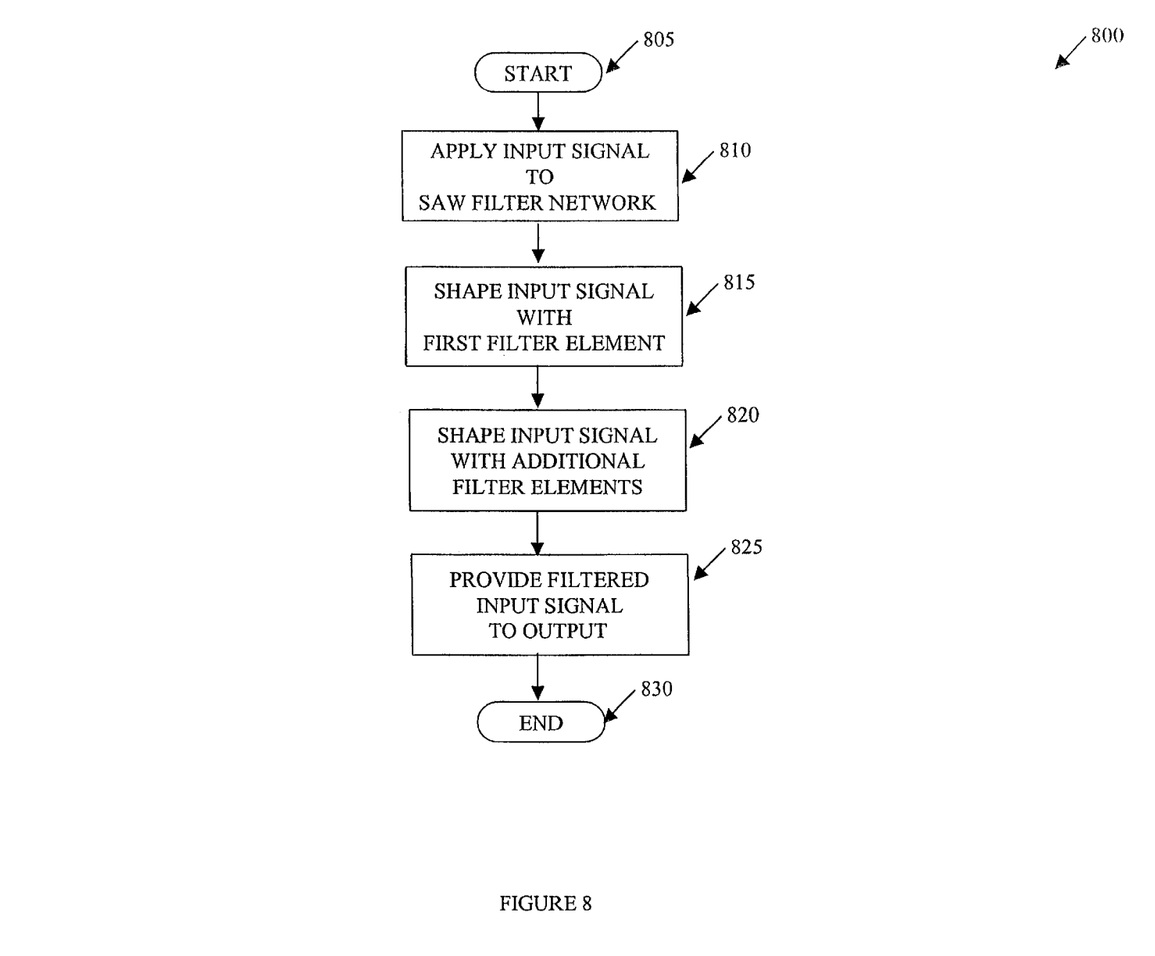
FIG. 8 illustrates a flow diagram of a method of filtering a signal carried out according to the principles of the present invention.

Turning now to FIG. 8, illustrated is a flow diagram of a method 800 of filtering a signal carried out according to the principles of the present invention. The method 800 starts in a step 805 when an input signal is applied to a SAW filter network resulting in the input signal being applied to a first SAW filter element in a step 810. In the illustrated embodiment, the-first SAW filter element in the step 810 includes a SAW resonator having a nominal bandwidth around a resonant frequency and a parallel coupled extrinsic capacitor that share common terminals. In the step 810, the extrinsic capacitor interacts with the SAW resonator to cause an anti-resonant frequency of the SAW filter element to move toward a resonant frequency thereby decreasing an overall bandwidth of the SAW filter element. In the illustrated embodiment, the extrinsic capacitor has an intrinsic resonant frequency that is greater than the resonant frequency of the SAW resonator. The intrinsic resonant frequency may be less, however, without departing from the spirit and scope of the present invention.

Continued input signal frequency shaping occurs through additional SAW filter elements employing SAW resonators that are parallel coupled to extrinsic capacitors in a step 820. Some of these SAW filter elements include first and second SAW resonators that are coupled in series with one another and parallel coupled to an extrinsic capacitor. In a step 825, the filtered input signal is provided to an output load, and the method 800 ends in a step 830.

In summary, the present invention introduces the broad concept of employing an extrinsic capacitor (a capacitor outside of the SAW resonator itself) to modify the anti-resonance frequency of the SAW resonator. The element (a combination of the SAW resonator and the extrinsic capacitor) is thereby imbued with a diminished bandwidth (passband or notch). Diminished bandwidths are particularly advantageous in low cost applications, wherein downstream signal processing benefits from improved filtering. Additionally, judicious combinations of SAW filter elements allows the construction of SAW filter networks, which may be designed to tailor required frequency response characteristics.

Although the present invention has been described in detail, those skilled in the art should understand that they can make various changes, substitutions and alterations herein without departing from the spirit and scope of the invention in its broadest form.

What is claimed is:

1. An element of a surface acoustic wave (SAW) filter network, comprising:

a first SAW resonator having a nominal bandwidth and a second SAW resonator having a nominal bandwidth non-transversely coupled in series with said first SAW resonator; and an extrinsic capacitor coupled in parallel with said first SAW resonator and said second SAW resonator, said extrinsic capacitor interacting with said first SAW resonator and said second SAW resonator to cause an anti-resonance frequency of said element to move toward a resonance frequency thereof and thereby decrease an overall operating bandwidth of said element.

2. The element as recited in claim 1 wherein said first SAW resonator and said second SAW resonator share common terminals with said extrinsic capacitor.

3. The element as recited in claim 1 wherein said extrinsic capacitor has an intrinsic resonant frequency greater than said resonance frequency.

4. The element as recited in claim 1 wherein said first SAW resonator and said second SAW resonator each comprise an interdigitated central region and opposing shorted end regions.

5. The element as recited in claim 1 wherein said SAW filter network has a resonance frequency between 900 and 920 megahertz.

6. A method of filtering a signal, comprising:

providing said signal to an element of a SAW filter network, said element comprising:

a first SAW resonator having a nominal bandwidth and a second SAW resonator having a nominal bandwidth non-transversely coupled in series with said first SAW resonator, and an extrinsic capacitor coupled in parallel with said first SAW resonator and said second SAW resonator, said extrinsic capacitor interacting with said first SAW resonator and said second SAW resonator to cause an anti-resonance frequency of said element to move toward a resonance frequency thereof and thereby decrease an overall operating bandwidth of said element; and filtering said signal with said element.

7. The method as recited in claim 6 wherein said first SAW resonator and said second SAW resonator share common terminals with said extrinsic capacitor.

8. The method as recited in claim 6 wherein said extrinsic capacitor has an intrinsic resonant frequency greater than said resonance frequency.

9. The method as recited in claim 6 wherein said first SAW resonator and said second SAW resonator each comprise an interdigitated central region and opposing shorted end regions.

10. The method as recited in claim 6 wherein said signal contains a component frequency between 900 and 920 megahertz.

11. A SAW filter network, comprising:

a plurality of interconnected SAW filter elements, each of said elements including:

a first SAW resonator having a nominal bandwidth and a second SAW resonator having a nominal bandwidth non-transversely coupled in series with said first SAW resonator, and an extrinsic capacitor coupled in parallel with said first SAW resonator and said second SAW resonator, said extrinsic capacitor interacting with said first SAW resonator and said second SAW resonator to cause an anti-resonance frequency of said element to move toward a resonance frequency thereof and thereby decrease an overall operating bandwidth of said network.

12. The network as recited in claim 11 wherein said first SAW resonator and said second SAW resonator share common terminals with said extrinsic capacitor.

13. The network as recited in claim 11 wherein said extrinsic capacitor has an intrinsic resonant frequency greater than said resonance frequency.

14. The network as recited in claim 11 wherein said first SAW resonator and said second SAW resonator each comprise an interdigitated central region and opposing shorted end regions.

15. The network as recited in claim 11 wherein said SAW filter network is a ladder having a resonance frequency between 900 and 920 megahertz.

* * * * *